(12) United States Patent
Kim

(10) Patent No.: US 8,441,025 B2
(45) Date of Patent: May 14, 2013

(54) LIGHT EMITTING DEVICE

(75) Inventor: Sun Kyung Kim, Yongin-si (KR)

(73) Assignee: LG Innotek Co., Ltd., Seoul (KR)

( * ) Notice: Subject to any disclaimer, the term of this patent is extended or adjusted under 35 U.S.C. 154(b) by 848 days.

(21) Appl. No.: 12/573,422

(22) Filed: Oct. 5, 2009

(65) Prior Publication Data

US 2010/0219434 A1    Sep. 2, 2010

(30) Foreign Application Priority Data

Mar. 2, 2009    (KR) .................. 10-2009-0017787

(51) Int. Cl.
    *H01L 29/72*    (2006.01)
(52) U.S. Cl.
    USPC .. 257/98; 257/13; 257/E33.008; 257/E33.067
(58) Field of Classification Search .............. 257/13,
    257/98, E33.008, E33.067
    See application file for complete search history.

(56) References Cited

U.S. PATENT DOCUMENTS

| 8,115,224 B2 | 2/2012 | Kim |
| 2005/0269588 A1 | 12/2005 | Kim et al. |
| 2007/0194324 A1 | 8/2007 | Kim et al. |
| 2008/0142824 A1 | 6/2008 | Chen et al. |
| 2008/0142825 A1 | 6/2008 | Chen et al. |
| 2008/0303419 A1* | 12/2008 | Fukuda ..................... 313/504 |
| 2009/0026478 A1 | 1/2009 | Yoon et al. |
| 2010/0038664 A1 | 2/2010 | Strauss |

FOREIGN PATENT DOCUMENTS

| DE | 10 2007 004302 | 4/2008 |
| DE | 10 2007 053297 | 3/2009 |
| KR | 10-2006-0006484 | 1/2006 |
| KR | 10-0640497 | 10/2006 |
| KR | 10-2008-0027584 | 3/2008 |
| KR | 10-2008-0058954 | 6/2008 |
| KR | 10-0843426 | 6/2008 |
| KR | 10-2008-0061693 | 7/2008 |
| KR | 10-2010-0085578 | 7/2010 |

OTHER PUBLICATIONS

Korean Office Action issued in KR Application No. 10-2009-0017787 dated Aug. 8, 2011.
Korean Office Action issued in KR Application No. 10-2009-0017787 dated Dec. 12, 2010.
Korean Notice of Allowance issued in KR Application No. 10-2009-0017787 dated Dec. 4, 2012.
European Search Report issued in EP Application No. 09176705.3 dated Mar. 8, 2013.

* cited by examiner

*Primary Examiner* — Edward Wojciechowicz
(74) *Attorney, Agent, or Firm* — KED & Associates, LLP

(57) ABSTRACT

A light emitting device is provided. The light emitting device may include a reflective layer having a prescribed pattern of at least one shape having prescribed thickness, width and periodicity. The light emitting device may also include a light emitting layer formed on the reflective layer. The prescribed periodicity may be based on $0.75\lambda/n$ to $5\lambda/n$, where $\lambda$ is the wavelength of the light emitted from the light emitting layer, and n is the refractive index of the light emitting layer.

20 Claims, 8 Drawing Sheets

US 8,441,025 B2

LIGHT EMITTING DEVICE

This claims priority under 35 U.S.C. 119 and 35 U.S.C. 365 to Korean Patent Application No. 10-2009-0017787, filed in Korea on Mar. 2, 2009, the entirety of which is hereby incorporated by reference in its entirety.

BACKGROUND

1. Field

This relates to a light emitting device.

2. Background

A light emitting diode (LED) is a semiconductor light emitting device that converts current to light. The wavelength of light emitted by such an LED depends on a band-gap of the semiconductor material used in the LED, the band gap representing an energy difference between a valence band and a conduction band. Recently, LEDs have been used as a light source for displays such as liquid crystal displays (LCDs), a light source for automobiles, and a light source for other types of lighting devices. An LED may emit white light by using phosphor materials or may emit various colors by combining LEDs having various colors. However, when the LEDs are used in certain applications, the efficiency of the LEDs may be significantly degraded.

BRIEF DESCRIPTION OF THE DRAWINGS

The embodiments will be described in detail with reference to the following drawings in which like reference numerals refer to like elements wherein.

DETAILED DESCRIPTION

Figure 1:
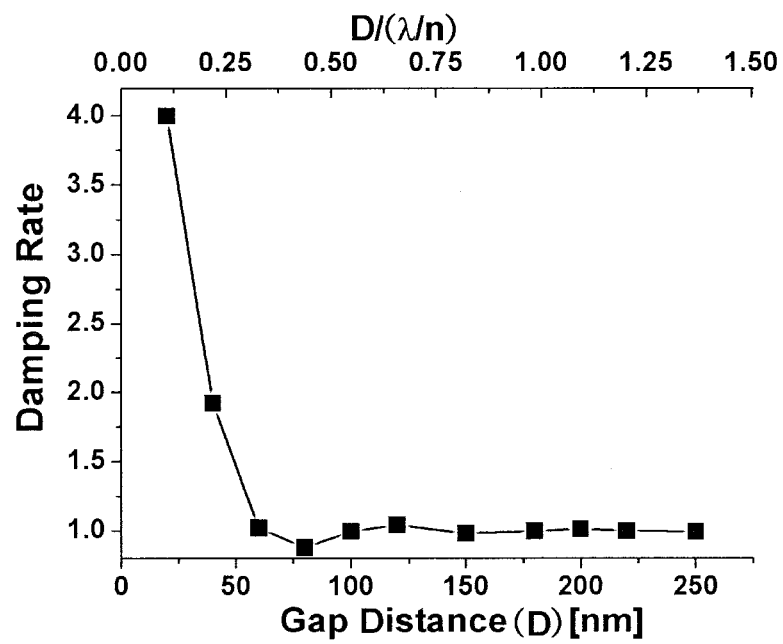
FIGS. 1 and 2 are graphs illustrating a change in damping rate according to a change in distance between an active layer and a reflective layer.

In the description of embodiments disclosed herein, in referring to each layer (film), region, pattern or structures being "on/under" a substrate, "on" and "under" may include both "directly" and "indirectly" "on" and "under". Any reference to "on" or "under" is based on the drawings. In the drawings, the thickness or size of each layer may be exaggerated, omitted or schematically illustrated for the convenience and clarity of explanation, and the size of each constituent does not necessarily reflect its actual size.

An LCD apparatus may produce various colors by controlling polarization of the light source. The light emitted by the light source may pass through a polarizer, so that the light passing through the polarizer has polarizing components in a specific direction.

Generally, light emitted by the light source has random polarization. Therefore, the intensity of light passing through the polarizer is reduced to, for example, half, and loss of light may not be prevented in order to generate light having polarizing components. An example of a liquid crystal display modules having LEDs is shown in U.S. Pat. No. 7,528,416 whose entire disclosure is incorporated herein by reference.

In certain embodiments, a vertical type light emitting device may be described, including a light emitting semiconductor layer including a first conductive type semiconductor layer, an active layer and a second conductive type semiconductor layer, a first electrode layer disposed on the light emitting semiconductor layer and a second electrode layer disposed under the light emitting semiconductor layer.

Light emitting efficiency of a vertical type light emitting device may be increased when a reflective layer having a relatively high reflectance is formed between the second conductive type semiconductor layer and the second electrode layer In the vertical type light emitting device having a reflective layer, the distance between the active layer and the reflective layer may be relatively close so that the distance between the active layer and the reflective layer is less than the wavelength of the light emitted from the active layer. As the distance between the active layer and the reflective layer is changed, a quantum interference effect may be generated so that the optical characteristics of the light emitting device may be changed. For example, as the distance between the active layer and the reflective layer is changed, a damping rate of a dipole source of the light emitted from the light emitting device may be changed.

Figure 2:
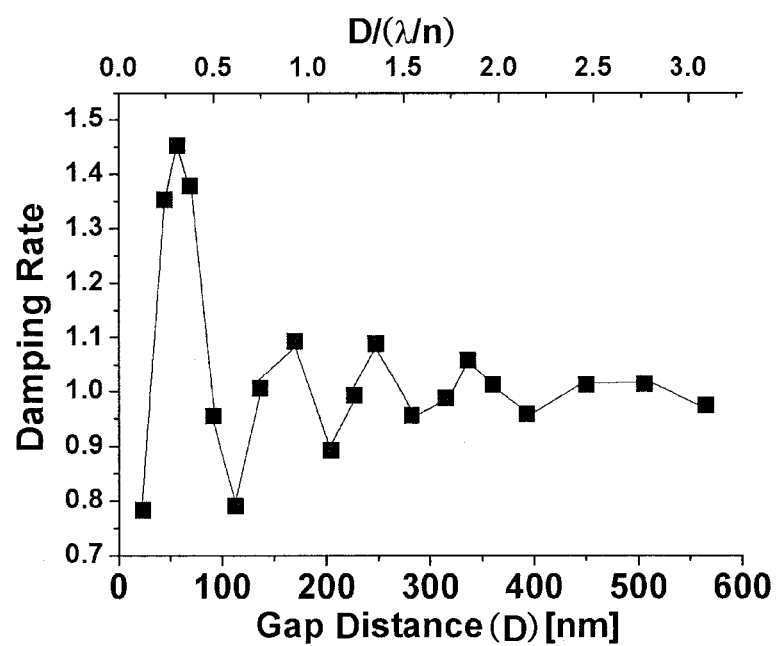

FIGS. 1 and 2 illustrate the change in damping rate according to the vibration direction of the dipole source of light emitted from a light emitting device according to the change in distance between an active layer and a reflective layer. In this scenario, the damping rate refers to a turnaround time in the light emitting device from the time at which electrons receive energy until the time at which the energy is emitted in the form of light. When the damping rate is increased, dipole source light emission is increased so that internal quantum efficiency may be improved.

Referring to FIGS. 1 and 2, the damping rate of the light emitted from the light emitting device is changed in relation to the gap distance D between the active layer and the reflective layer, the refractive index of material that forms the light emitting device, and the wavelength emitted from the light emitting device.

In FIGS. 1 and 2, the Y axis represents the damping rate, the lower X axis represents the distance D between the active layer and the reflective layer, and the upper X axis represents the relative value obtained by dividing the distance D between the active layer and the reflective layer by $\lambda/n$ in which, $\lambda$ represents the peak wavelength of the light emitted from the light emitting device, and n represents the refractive index of material that forms the light emitting device.

In other words, assuming that the refractive index n of material that forms the light emitting device and the peak wavelength λ of the light emitted from the light emitting device are each constant, the damping rate according to the vibration direction of the dipole source of the light emitted from the light emitting device is changed as the distance D between the active layer and the reflective layer is changed.

In FIGS. 1 and 2, the damping rate of a GaN-based light emitting device having refractive index n of approximately 2.46, emitting blue light having peak wavelength λ of approximately 450 nm, is shown, and the value 1.0 on the upper X axis corresponds to approximately 188.3 nm (=450 nm/2.46) on the lower X axis. As shown in FIG. 1, in the case of a dipole source that vibrates vertically with respect to an x-y plane, the damping rate is increased as the distance between the active layer and the reflective layer becomes shorter. As shown in FIG. 2, in the case of a dipole source that vibrates in parallel to the x-y plane, the maximum value of the damping rate is shown at a specific distance (for example, 50 nm).

As described above, in the vertical type light emitting device, the distance between the active layer and the reflective layer is shorter than the wavelength of the light emitted from the light emitting device, so optical characteristics can be changed according to the change in the distance D between the active layer and the reflective layer.

Changing the damping rate of the dipole source that vibrates vertically with respect to the x-y plane and changing the damping rate of the dipole source that vibrates in parallel to the x-y plane by changing the distance D between the active layer and the reflective layer have been explained above with respect to FIGS. 1 and 2. Light having a great quantity of polarizing components in a specific direction may be emitted by changing the damping rate of a dipole source that vibrates in the X direction with respect to the light emitted from the active layer and the changing damping rate of a dipole source that vibrates in the Y direction with respect thereto by forming a polarization induction pattern between a second conductive type semiconductor layer and a reflective layer will be described hereinafter.

Figure 3:
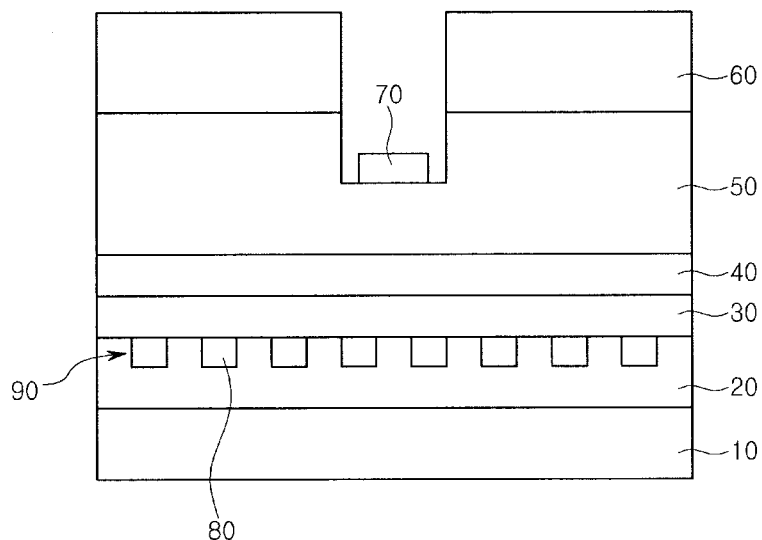
FIG. 3 illustrates a light emitting device according to an embodiment as broadly described herein.

FIG. 3 illustrates a light emitting device according to a first embodiment as broadly described herein. The light emitting device includes a first electrode layer 10, a reflective layer 20 formed on the first electrode layer 10, patterned layers 80 formed on the reflective layer 20, a first conductive type semiconductor layer 30 formed on the reflective layer 20 and the patterned layers 80, an active layer 40 formed on the first conductive type semiconductor layer 30, a second conductive type semiconductor layer 50 formed on the active layer 40, and a second electrode layer 70 formed on the second conductive type semiconductor layer 50. A non-conductive semiconductor layer 60 may be selectively formed on the second conductive type semiconductor layer 50.

The first electrode layer 10, which may be formed of at least one of copper (Cu), titanium (Ti), chrome (Cr), nickel (Ni), aluminum (Al), platinum (Pt), gold (Au), tungsten (W) or a semiconductor substrate implanted with impurity, is used to provide power to the active layer 40 together with the second electrode layer 70. The reflective layer 20 may be partially opposed to the first conductive type semiconductor layer 30 and may be formed of at least one of silver (Ag) having a high reflectance, an alloy including silver (Ag), aluminum (Al), or an alloy including aluminum (Al). An adhesive metal layer (not shown in detail in FIG. 3) including nickel (Ni) or titanium (Ti) may also be formed between the first electrode layer 10 and the reflective layer 20 to reinforce interface adhesion between the second electrode layer 10 and the reflective layer 20. An ohmic layer (not shown in detail in FIG. 3) that provides ohmic contact may also be formed between the reflective layer 20 and the first conductive type semiconductor layer 30.

The patterned layer 80 is formed on an upper portion of the reflective layer 20 and under the first conductive type semiconductor layer 30. In certain embodiments, as shown in FIG. 3, the side surfaces of the patterned layer 80 may be partially surrounded by the reflective layer 20. For example, the reflective layer 20 may have projection parts that project upward from its upper surface, and the patterned layer 80 may be disposed between the projection parts. Thus, the projection parts of the reflective layer 20 and the patterned layer 80 may be at least partially disposed on the same horizontal plane. The patterned layer 80 and the reflective layer 20 may form a polarization induction pattern 90.

The patterned layer 80 may be formed of a non-metal material, so that the refractive index of the patterned layer 80 is greater than the refractive index of air and is less than the refractive index of the first conductive type semiconductor layer 30. The patterned layer 80 may be formed as a transparent electrode and, for example, may be formed of at least any one of ITO, ZnO, GZO, RuOx or IrOx.

When the patterned layer 80 is formed as a transparent electrode, current may flow through the patterned layer 80 so that the patterned layer 80 may not be formed spaced apart at a predetermined interval, as shown in FIG. 3. Rather, the patterned layer 80 may be formed on the entire region between the first conductive type semiconductor layer 30 and the reflective layer 20. In this case, a pattern that is projected in a shape similar to the patterned layer 80 may be formed on the surface opposing the reflective layer 20.

In alternative embodiments, the patterned layer 80 may be formed of dielectrics such as, for example, at least any one of $SiO_2$, $MgF_2$, SOG, $TiO_2$, $Al_2O_3$ or $Si_3N_4$. When the patterned layer 80 is formed of dielectrics, current does not flow through the patterned layer 80, and so the patterned layer 80 is formed of components spaced at a predetermined interval, as shown in FIG. 3. In other words, in this case, the first conductive type semiconductor layer 30 and the reflective layer 20 are partially opposed to each other.

The reflective layer 20 and the patterned layer 80 form the polarization induction pattern 90 that allows the light emitted from the light emitting device to have a polarizing component in a specific direction. The polarization induction pattern 90 controls the polarization of the light emitted from the active layer 40 through a symmetric pattern formed on the interface between the patterned layer 80 and the reflective layer 20. Thus, in such a light emitting device, the polarization induction pattern 90 is disposed in a range shorter than the wavelength of the emitted light, thereby allowing light having a great quantity of polarizing components in a specific direction to be emitted by a spontaneous emission process. This is different from a method in which light having random polarization has polarizing components in a specific direction due to the use of a polarizer. In a polarization induction pattern 90 as embodied and broadly described herein, a reduction in optical efficiency to achieve a particular polarization may thus be avoided.

The first conductive type semiconductor layer 30 may be formed of a GaN-based semiconductor layer implanted with p-type impurities, and the second conductive type semiconductor layer 50 may be formed of a GaN-based semiconductor layer implanted with n-type impurities. The active layer 40, which is a light emitting layer, may be formed of at least one of a single quantum well structure, a multi quantum well (MQW) structure, a quantum-wire structure, or a quantum dot structure. Other variations of Group III-IV semiconductor materials may be used.

The non-conductive semiconductor layer 60 may be a semiconductor layer having a noticeably lower electrical conductivity compared to the second conductive type semiconductor layer 50 and the first conductive type semiconductor layer 30. For example, the non-conductive semiconductor layer 60 may be an undoped GaN layer.

As described above, in the light emitting device as embodied and broadly described herein, the polarization induction pattern 90 includes the patterned layer 80 formed of the transparent electrode or the dielectrics between the first conductive type semiconductor layer 30 and the reflective layer 20, and the reflective layer 20 disposed on the lower surface and the side surfaces of the patterned layer 80.

Figure 4:
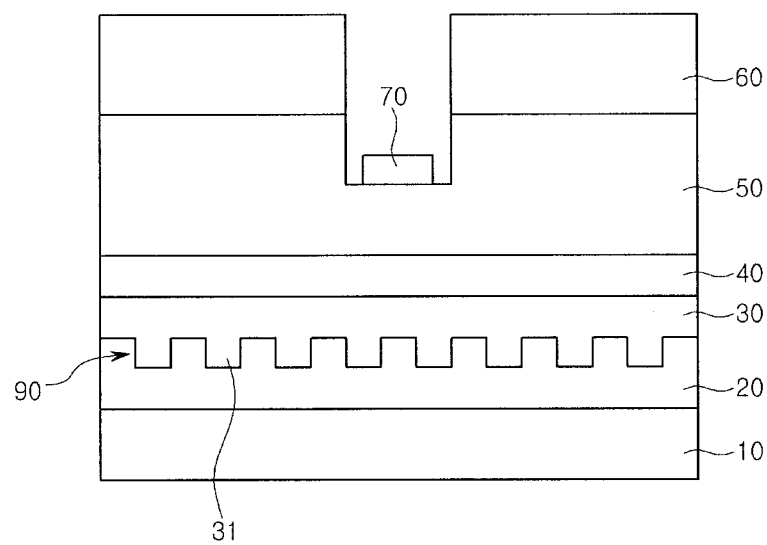
FIG. 4 illustrates a light emitting device according to another embodiment as broadly described herein.

FIG. 4 illustrates a light emitting device according to another embodiment as broadly described herein. The light emitting device shown in FIG. 4 may include a first electrode layer 10, a reflective layer 20 formed on the first electrode layer 10, a first conductive type semiconductor layer 30 having projection patterns 31 that extend toward the reflective layer 20, an active layer 40 formed on the first conductive type semiconductor layer 30, a second conductive type semiconductor layer 50 formed on the active layer 40, and a second electrode layer 70 formed on the second conductive type semiconductor layer 50. A non-conductive semiconductor layer 60 may be selectively formed on the second conductive type semiconductor layer 50. The projection patterns 31 of the first conductive type semiconductor layer 30 and the reflective layer 20 form a polarization induction pattern 90.

The projection patterns 31 may project towards the reflective layer 20 and be spaced at predetermined intervals such that the lower surface and the side surfaces of the projection pattern 31 are opposed to the reflective layer 20.

The projection pattern 31 may be formed by being selectively etched after the first conductive type semiconductor layer 30 is formed or by roughening the surface of the first conductive type semiconductor layer 30 by controlling the growth condition of the first conductive type semiconductor layer 30. The projection pattern 31 may be formed as the GaN-based semiconductor layer so as to form patterned layer as described above. The polarization induction pattern 90 is formed by the projection pattern 31 of the first conductive type semiconductor layer 30 that is formed as a GaN-based semiconductor layer, and the reflective layer 20 that is a metal mirror contacting the projection pattern 31.

Figure 5:
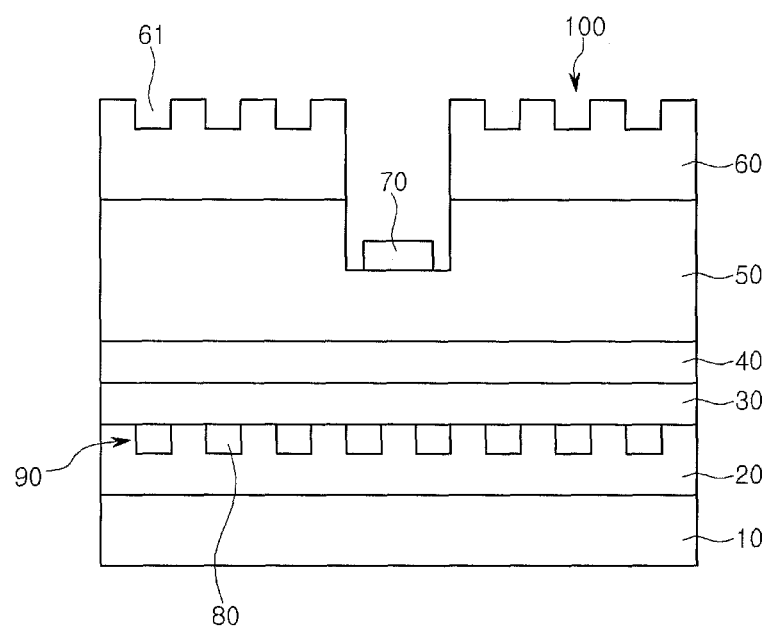
FIG. 5 illustrates a light emitting device according to another embodiment as broadly described herein.

FIG. 5 illustrates a light emitting device according to another embodiment as broadly described herein. The light emitting device shown in FIG. 5 may include a first electrode layer 10, a reflective layer 20 formed on the first electrode layer 10, patterned layers 80 formed on the reflective layer 20, a first conductive type semiconductor layer 30 formed on the reflective layer 20 and the patterned layers 80, an active layer 40 formed on the first conductive type semiconductor layer 30, a second conductive type semiconductor layer 50 formed on the active layer 40, a second electrode layer 70 formed on the second conductive type semiconductor layer 50, and a non-conductive semiconductor layer 60 formed on the second conductive type semiconductor layer 50. A photonic crystal structure 100 having a pillar or a hole shape may be formed on the non-conductive semiconductor layer 60, with pillars or holes 61 disposed at predetermined intervals or in a random shape so as to improve extracting efficiency of the light emitted from the light emitting device.

The photonic crystal structure 100 formed on the non-conductive semiconductor layer 60 shown in FIG. 5 may also be applied to the embodiment of the light emitting device shown in FIG. 4. In alternative embodiments, the photonic crystal structure 100 may be formed on the second conductive type semiconductor layer 50 by removing the non-conductive semiconductor layer 60. This may also be applied to the embodiment shown in FIG. 4.

Figure 6:
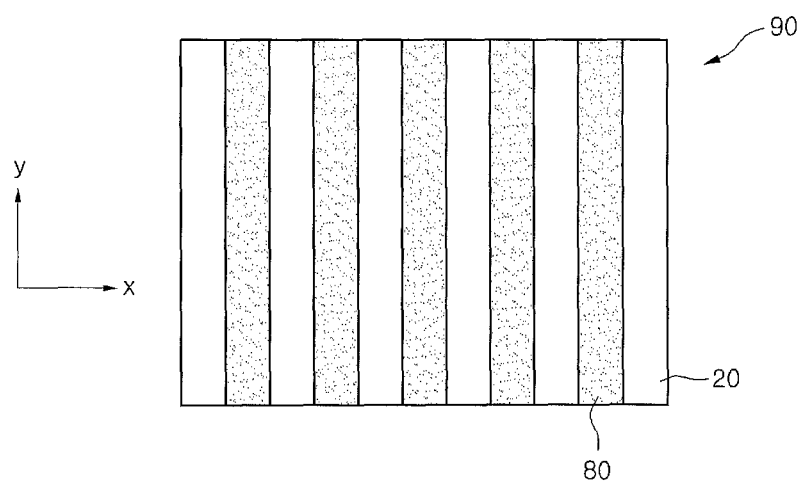
FIGS. 6 to 8 illustrate polarization induction patterns in the light emitting devices shown in FIGS. 3-5.
Figure 7:
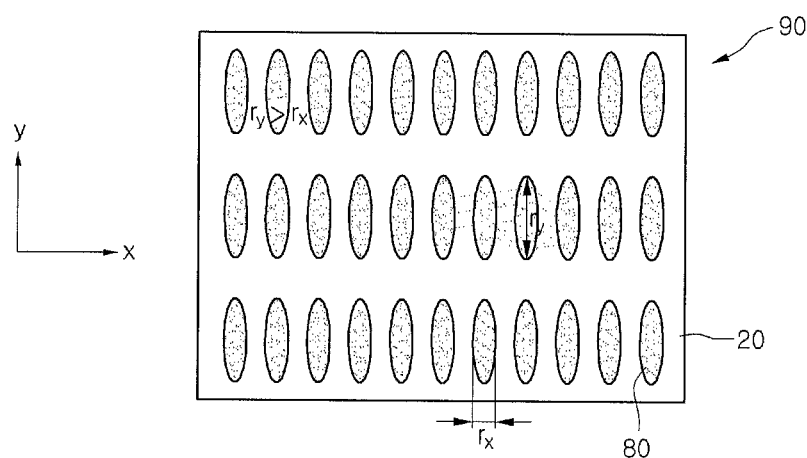
Figure 8:
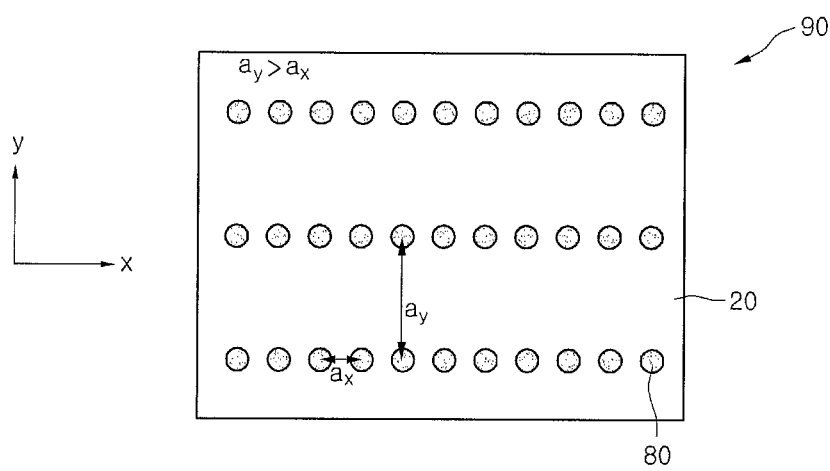

FIGS. 6 to 8 are diagrams of polarization induction patterns in the light emitting devices according to embodiments as broadly described herein. The polarization induction patterns 90 are plan views illustrate the shapes of the polarization induction patterns 90 as viewed on the x-y plane, whereas the polarization induction patterns 90 shown in FIGS. 3 to 5 are shown as an elevation type view. The polarization induction patterns 90 shown in FIGS. 6 to 8 are exemplary in nature, and the present disclosure is not limited thereto.

Also, in FIGS. 6 to 8 the patterned layer 80 formed on the reflective layer 20 is exemplified as described in the embodiment shown in FIG. 3, but the present disclosure may also be applied to the case where the projection patterns 31 are formed on the reflective layer 20 as described in the embodiment shown in FIG. 4.

As shown in the plan view of the polarization induction pattern 90 in FIGS. 6 to 8, the patterned layer 80 is formed on the reflective layer 20 having components thereof partially spaced apart. In alternative embodiments, the reflective layer 20 may be formed on the patterned layer 80 having components partially spaced apart. In this case, the period or width of the patterned layer 80 may be replaced by the period or width of the reflective layer 20.

In the embodiment shown in FIG. 6, the polarization induction pattern 90 has patterned layers 80 formed on the reflective layer 20 in a line shape. In particular, a plurality of patterned layers 80 are formed in a line shape, spaced apart at a predetermined interval in a first direction. The patterned layers 80 extend in a first direction and are spaced apart at a predetermined interval along a second direction that is perpendicular to the first direction. For example, the patterned layers 80 may each have a line shape that that extend in a y direction, and may be spaced apart in an x direction. Thus, the patterned layers 80 have periodicity in the x direction, but do not have periodicity in the y direction.

In the embodiment shown in FIG. 7, the polarization induction pattern 90 has patterned layers 80 having different lengths in a first direction and in a second direction perpendicular to the first direction formed on the reflective layer 20. In particular, in the patterned layer 80 shown in FIG. 7, the length in the y direction ry is greater than the length in the x direction rx, and the patterned layer 80 may have an elliptical shape having a longer length in the y direction than in the x direction.

In the embodiment shown in FIG. 8, the patterned layers 80 are disposed on the reflective layer 20, having a different period in a first direction than in a second direction that is perpendicular to the first direction, that is, having different intervals. For example, the patterned layers 80 may have a circular shape, and the period ax in the x direction may be less than the period ay in the y direction.

Thus, in the polarization induction patterns 90 shown in FIGS. 6 to 8, the patterned layers 80 may be disposed along the first direction and the second direction perpendicular to the first direction, may be formed in a line shape and extend in the first direction or in the second direction, or may have different periods or sizes for the first direction and the second direction.

In certain embodiments, the pattern density of the patterned layers 80 that are disposed in a row in the first direction may be different from the pattern density of the patterned layers 80 that are disposed in a row in the second direction.

In alternative embodiments, the pattern density of the patterned layers 80 that are disposed in a row in the first direction may be identical to the pattern density of the patterned layers 80 that are spaced along the second direction at a predetermined interval to be disposed in a row in the first direction.

The patterned layers 80 may be formed having certain regularities in the first direction and the second direction, wherein the regularity in the first direction and the regularity in the second direction may be different from each other.

Figure 9:
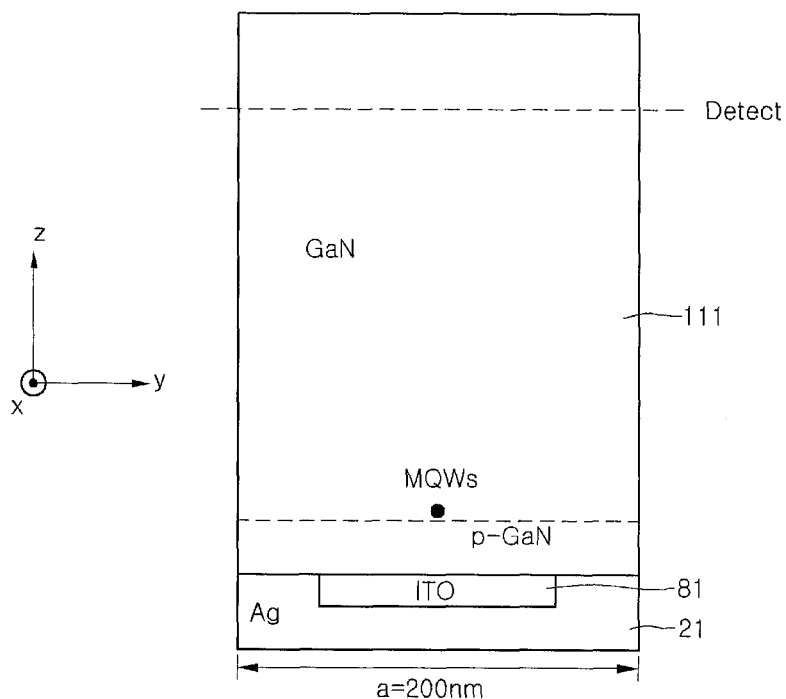
FIG. 9 is a structure simulating the polarization ratio of light emitted from the light emitting devices shown in FIGS. 3-5 by the polarization induction patterns shown in FIGS. 6-8.
Figure 10:
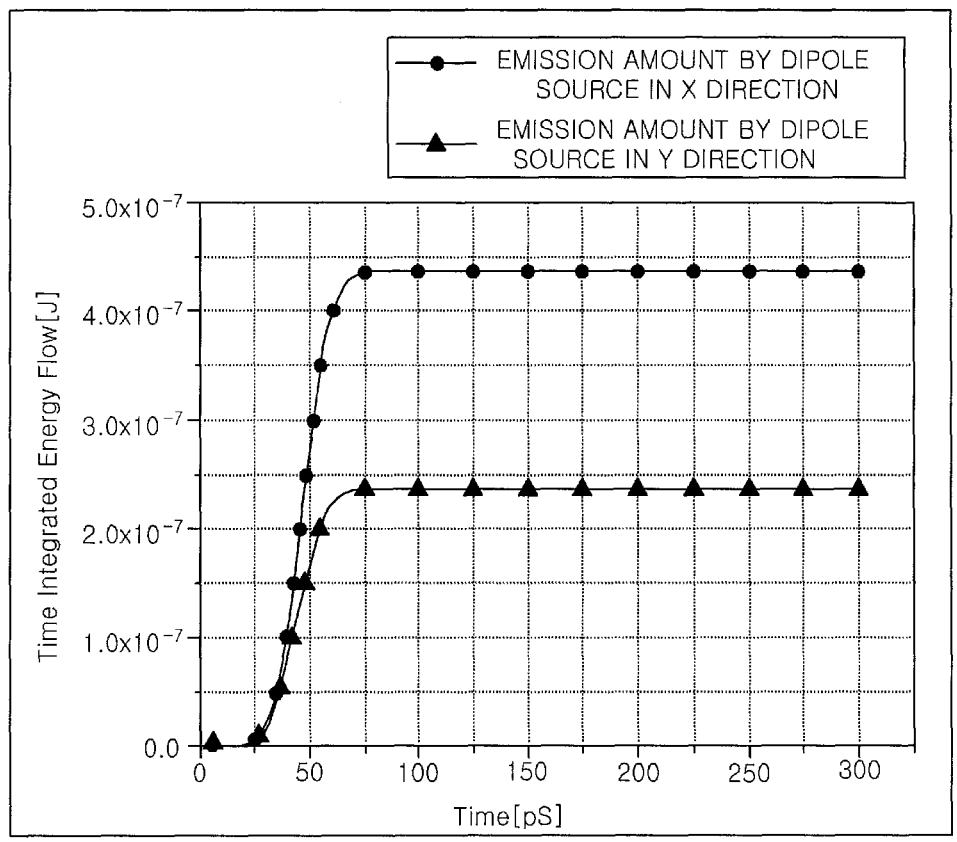
FIG. 10 illustrates the results obtained by simulating the polarization ratio of light emitted from the light emitting devices of FIGS. 3-5 having the polarization induction patterns of FIGS. 6-8.

FIGS. 9 and 10 illustrate the polarization ratio of light emitted from the light emitting devices of FIGS. 3-5 having the polarization induction patterns shown in FIGS. 6-8.

Referring to FIGS. 9 and 10, a transparent electrode pattern 81 formed of ITO having a line shape, and having a thickness of approximately 100 nm, is formed on a reflective mirror 21 formed of silver (Ag), and a light emitting layer 111 formed of GaN material is formed on the transparent electrode pattern 81 and the reflective mirror 21. A period a of the transparent electrode pattern 81 is set to approximately 200 nm.

In certain embodiments the light emitting layer 111 may be provided with multiple quantum well structures MQWs, having a p-GaN layer with a thickness of approximately 60 nm therebetween. And, when a dipole source that vibrates in the x direction and a dipole source that vibrates in the y direction are applied, respectively, in the simulation structure as described above and shown in FIG. 9, total emission amount may be detected from the upper direction (z direction). The total emission amount may correspond to a spontaneous emission rate.

Based on this configuration, the total emission amount by the dipole source that vibrates in the x direction in parallel to the direction that the transparent electrode pattern 81 extends is greater than the total emission amount by the dipole source that vibrates in the y direction by 1.8 times or more. Light having a large amount of polarizing components in a specific direction can be emitted from the light emitting device according to the embodiments as broadly described herein.

Figure 11:
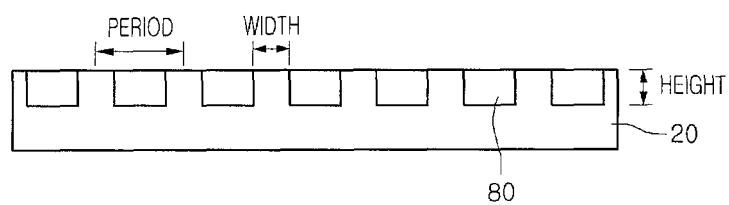
FIG. 11 is a diagram of the period, width and height of the polarization induction pattern of a light emitting device according to embodiments as broadly described herein.
Figure 12:
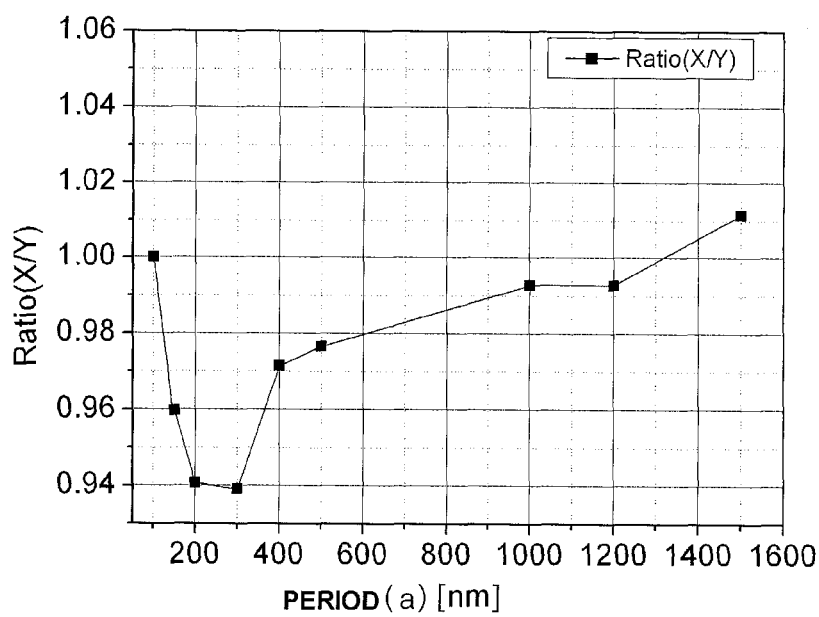
FIG. 12 is a graph of polarization ratio as a function of the period of the polarization induction pattern.
Figure 13:
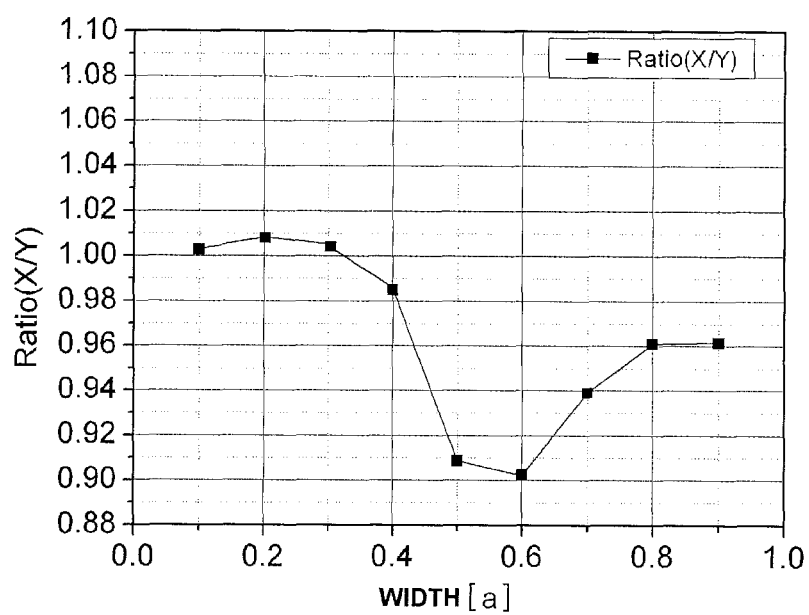
FIG. 13 is a graph of polarization ratio as a function of the width of the polarization induction pattern.
Figure 14:
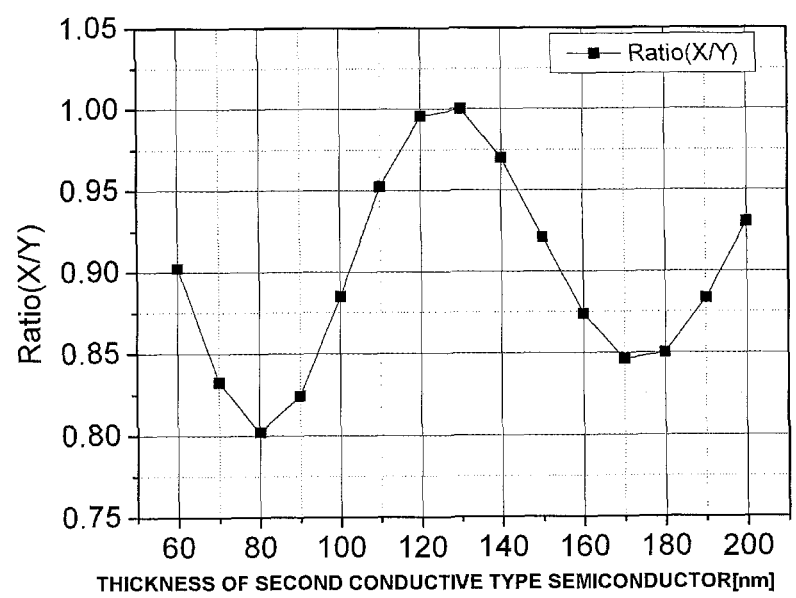
FIG. 14 is a graph of polarization ratio as a function of the thickness of the first conductive type semiconductor layer of the polarization induction pattern.

FIG. 11 is a diagram explaining the period, or interval, width and height of the polarization induction pattern in the light emitting devices according to embodiments as broadly described herein, FIG. 12 illustrates the polarization ratio according to the period of the polarization induction pattern, FIG. 13 illustrates the polarization ratio according to the width of the polarization induction pattern, and FIG. 14 illustrates the polarization ratio according to the thickness of the first conductive type semiconductor layer of the polarization induction pattern.

As shown in FIG. 11, the period a in the polarization induction pattern refers to the distance between centers of adjacent patterns projected from a reflective layer 20, the width refers to the distance between two ends of a patterned layer 80, and the height refers to the thickness of the patterned layer 80.

Referring to FIG. 12, it can be appreciated that in a polarization induction pattern where the thickness of a first conductive type semiconductor layer is approximately 60 nm, the height of the patterned layer is approximately 100 nm, and the width of the patterned layer is approximately 70 nm, the polarization control effect is excellent when the period a of the patterned layer is approximately 150 nm to 600 nm. Here, a ratio of 1 indicates no polarization control effect. For example, if the wavelength of the light emitted from the light emitting device is $\lambda$ and the refractive index of material that forms the light emitting layer is n, the period a of the patterned layer may be selected from $0.75\lambda/n$ to $5\lambda/n$.

Referring to FIG. 13, it can be appreciated that in a polarization induction pattern where the thickness of the first conductive type semiconductor layer is approximately 60 nm, the height of the patterned layer is approximately 100 nm, and the width of the patterned layer is approximately 300 nm, the polarization control effect is excellent when the width of the patterned layer is approximately 0.4 a nm to 0.9 a nm.

Referring to FIG. 14, it can be appreciated that in a polarization induction pattern where the height of the patterned layer is approximately 100 nm, the width of the patterned layer is approximately 60 nm, and the period of the patterned layer is approximately 300 nm, the polarization control effect is changed as the thickness of the first conductive type semiconductor layer is changed. It can be appreciated that the change period of the polarization control effect is $\lambda/2n$, and the thickness of the first conductive type semiconductor layer that has the excellent polarization control effect is $0.75\,m\lambda/2n$ to $1.25\,m\lambda/2n$. In this distance, m refers to a natural number.

The present disclosure teaches a light emitting device, comprising a polarization induction pattern comprising a reflective layer and non-metal patterns on the reflective layer; a second conductive type semiconductor layer on the polarization induction patter; an active layer on the second conductive type semiconductor layer; and a first conductive type semiconductor layer on the active layer.

The polarization induction pattern is formed in a line shape, and a plurality of polarization induction patterns are extended in a first direction to be spaced along a second direction vertical to the first direction. The polarization induction pattern has a length in the first direction different from a length in the second direction vertical to the first direction, and a plurality of polarization induction patterns are disposed in the first direction and in the second direction.

A plurality of polarization induction patterns are disposed in the first direction and the second direction vertical to the first direction, in which a period disposed along the first direction is different from a period disposed along the second direction. A plurality of polarization induction patterns are disposed along the first direction and the second direction vertical to the first direction, in which pattern density of the polarization induction patterns disposed on a straight line along the first direction is different from pattern density of the polarization induction patterns disposed on a straight line along the second direction.

A plurality of polarization induction patterns are disposed having regularities along the first direction and the second direction vertical to the first direction, in which the regularity of the polarization induction patterns disposed in the first direction is different from the regularity of the polarization induction patterns disposed in the second direction.

The lower surface and the side surface of the non-metal pattern are opposed to the reflective layer. The non-metal pattern is formed of a transparent electrode or dielectrics. The upper surface of the non-metal pattern is spaced by the upper surface of the reflective layer or the upper of the reflective layer is spaced by the upper surface of the non-metal pattern.

The period of the non-metal pattern or the reflective layer is $0.75\lambda/n$ to $5\lambda/n$, $\lambda$ is the wavelength of the light emitted from the light emitting semiconductor layer of the light emitting device, and n is the refractive index of the material that forms the light emitting semiconductor layer. The period of the non-metal pattern or the reflective layer is 150 to 600 nm. The width of the non-metal pattern is 0.4 a to 0.9 a, where a is the period of the non-metal pattern. The width of the reflective layer is 0.4 a to 0.9 a, where a is the period of the reflective layer.

The thickness of the second conductive type semiconductor layer is 0.75 m$\lambda$/2n to 1.25 m$\lambda$/2n, where $\lambda$ is the wavelength of the light emitted from the light emitting semiconductor layer of the light emitting device, n is the refractive index of the material that forms the light emitting semiconductor layer, and m is a natural number. The non-metal pattern is a projection pattern that the second conductive type semiconductor layer is projected in a direction that the reflective layer is disposed.

The present disclosure also teaches a light emitting device, comprising a polarization induction pattern comprising a reflective layer having a projection part projected in the upper direction and non-metal pattern of which at least portion is disposed on the same horizontal plane with the projection part of the reflective layer; a second conductive type semiconductor layer on the polarization induction pattern; an active layer on the second conductive type semiconductor layer; and a first conductive type semiconductor layer on the active layer, wherein one of the projection part of the reflective layer and the non-metal pattern is spaced by the other.

The polarization induction pattern is formed in a line shape, and wherein a plurality of polarization induction patterns are extended in a first direction to be spaced along a second direction vertical to the first direction. The polarization induction pattern has a length in the first direction different from a length in the second direction vertical to the first direction, and wherein a plurality of polarization induction patterns are disposed in the first direction and in the second direction.

A plurality of polarization induction patterns are disposed in the first direction and the second direction vertical to the first direction, in which a period disposed along the first direction is different from a period disposed along the second direction. The plurality of polarization induction patterns are disposed along the first direction and the second direction vertical to the first direction, in which pattern density of the polarization induction patterns disposed on a straight line along the first direction is different from pattern density of the polarization induction patterns disposed on a straight line along the second direction.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a reflective layer including a plurality of first projections;
a patterned layer on an upper portion of the reflective layer, wherein the patterned layer is disposed between adjacent projections of the plurality of projections; and
a light emitting layer formed on the reflective layer, the light emitting layer comprising:
a first conductive type semiconductor layer provided on the patterned layer;
an active layer provided on the first conductive type semiconductor layer; and
a second conductive type semiconductor layer provided on the active layer,
wherein the patterned layer includes a plurality of second projections respectively extending into spaces between the adjacent projections, the plurality of projections having at least one cross sectional shape having a prescribed thickness and width and being formed along the patterned layer at a prescribed periodicity of 0.75$\lambda$/n to 5$\lambda$/n, where $\lambda$ is the wavelength of the light emitted from the light emitting layer, and n is the refractive index of the light emitting layer.

2. The light emitting device of claim 1, wherein the at least one cross-sectional shape is linear and extends in a first direction, and is repeated in a second direction, which is perpendicular to the first direction, and adjacent linear shapes being spaced apart by a prescribed distance in the second direction corresponding to the prescribed periodicity.

3. The light emitting device of claim 1, wherein the at least one cross-sectional shape has a width which is different from a length, and the at least one cross-sectional shape is repeated in a first direction and a second direction, the first direction being perpendicular to the second direction.

4. The light emitting device of claim 3, wherein the first and second distances are different from each other.

5. The light emitting device of claim 3, wherein a pattern density of the at least one cross-sectional shape in the first direction is different from a pattern density of the at least one cross-sectional shape in the second direction.

6. The light emitting device of claim 1, wherein the at least one cross-sectional shape is repeated in the first direction and in the second direction to form the plurality second projections, wherein adjacent second projections are spaced apart by a first prescribed distance in the first direction, and adjacent second projections are spaced apart by a second prescribed distance in the second direction, the first and second distances being different.

7. The light emitting device of claim 1, wherein a lower surface and side surfaces of the at least one cross-sectional shape overlap at least one surface of the light emitting layer.

8. The light emitting device of claim 1, wherein a top surface of the at least one cross-sectional shape only contacts a surface of the light emitting layer.

9. The light emitting device of claim 1, wherein the at least one cross-sectional shape is formed of a transparent material or a dielectric material.

10. The light emitting device of claim 1, wherein 0.75$\lambda$/n to 5$\lambda$/n corresponds to approximately 150 nm to 600 nm.

11. The light emitting device of claim 1, wherein a width of the at least one cross-sectional shape is 0.4a to 0.9a, where a corresponds to 0.75$\lambda$/n to 5$\lambda$/n.

12. The light emitting device of claim 1, wherein the thickness of the first conductive type semiconductor layer is 0.75m$\lambda$/2n to 1.25m$\lambda$/2n, m being a natural number.

13. A light emitting device, comprising:
a reflective layer having a plurality of first projections;
a first semiconductor layer formed on the reflective layer, the first semiconductor layer having a plurality of second projections;

an active layer formed on the first semiconductor layer; and
a second semiconductor layer formed on the active layer,
wherein the plurality of second projections extend from a surface of the first semiconductor layer toward the reflective layer and are respectively coupled between adjacent first projections of the plurality of first projections of the reflective layer, and
wherein each of the plurality of second projections has a prescribed cross-sectional shape having a prescribed thickness and width, and protrude from the first semiconductor layer at a prescribed periodicity, the prescribed periodicity being $0.75\lambda/n$ to $5\lambda/n$, where $\lambda$ is the wavelength of the light emitted from the light emitting layer, and n is the refractive index of the light emitting layer.

14. The light emitting device of claim 13, wherein the at least one cross-sectional shape is linear and extends in a first direction, and is repeated in a second direction, which is perpendicular to the first direction, adjacent linear shapes being spaced apart by a prescribed distance in the second direction corresponding to the prescribed periodicity.

15. The light emitting device of claim 13, wherein the at least one cross-sectional shape has a width which is different from a length, and the at least one cross-sectional shape is repeated in a first direction and a second direction, the first direction being perpendicular to the second direction.

16. The light emitting device of claim 15, wherein a pattern density of the at least one cross-sectional shape in the first direction is different from a pattern density of the at least one cross-sectional shape in the second direction.

17. The light emitting device of claim 13, wherein the at least one shape is repeated in the first direction and is repeated in the second direction to form the plurality of second projections, wherein adjacent second projections are separated by a first prescribed distance in the first direction, and adjacent second projections are spaced apart by a second prescribed distance in the second direction, the first and second distances being different.

18. The light emitting device of claim 13, wherein $0.75\lambda/n$ to $5\lambda/n$ corresponds to approximately 150 nm to 600 nm.

19. The light emitting device of claim 13, wherein a width of the at least one cross-sectional shape is 0.4a to 0.9a, where a corresponds to $0.75\lambda/n$ to $5\lambda/n$.

20. The light emitting device of claim 13, wherein the thickness of the first conductive type semiconductor layer is $0.75\,m\lambda/2n$ to $1.25\,m\lambda/2n$, m being a natural number.

* * * * *